(12) United States Patent
Hayashizaki (10) Patent No.: US 10,768,207 B2
(45) Date of Patent: Sep. 8, 2020

(54) ELECTRICAL CONNECTION DEVICE

(71) Applicant: Kabushiki Kaisha Nihon Micronics, Tokyo (JP)

(72) Inventor: Takayuki Hayashizaki, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 16/604,546

(22) PCT Filed: Apr. 3, 2018

(86) PCT No.: PCT/JP2018/014252
§ 371 (c)(1),
(2) Date: Oct. 10, 2019

(87) PCT Pub. No.: WO2018/193832
PCT Pub. Date: Oct. 25, 2018

(65) Prior Publication Data
US 2020/0124639 A1    Apr. 23, 2020

(30) Foreign Application Priority Data

Apr. 21, 2017  (JP) .................................. 2017-084468

(51) Int. Cl.
*G01R 1/073* (2006.01)
*G01R 31/26* (2020.01)

(52) U.S. Cl.
CPC ............. *G01R 1/073* (2013.01); *G01R 31/26* (2013.01)

(58) Field of Classification Search
CPC ................................ G01R 1/073; G01R 31/26

USPC .......................................................... 439/482
See application file for complete search history.

(56) References Cited

U.S. PATENT DOCUMENTS

| | | | | |
|---|---|---|---|---|
| 4,843,315 A | * | 6/1989 | Bayer ................ | G01R 1/07357 324/72.5 |
| 5,009,613 A | * | 4/1991 | Langgard .............. | H01R 11/18 439/482 |
| 5,320,559 A | * | 6/1994 | Uratsuji ............... | H01R 12/714 439/482 |
| 5,791,912 A | * | 8/1998 | Riechelmann ....... | H01R 43/007 439/66 |
| 6,411,112 B1 | * | 6/2002 | Das .................... | G01R 1/07357 324/754.2 |
| 6,417,684 B1 | * | 7/2002 | Schmid ............. | G01R 1/07357 324/750.25 |

(Continued)

FOREIGN PATENT DOCUMENTS

| | | |
|---|---|---|
| JP | S63132362 A | 6/1988 |
| JP | S63132362 U | 8/1988 |

(Continued)

*Primary Examiner* — Harshad C Patel
(74) *Attorney, Agent, or Firm* — Lorenz & Kopf, LLP (57) ABSTRACT

An electrical connection device includes: a probe head (20) including a guide hole (200), in which a shape perpendicular to an extending direction of the guide hole (200) is a shape formed by round-chamfering corner portions of a polygonal shape; and a probe (10) held by the probe head (20) in a state of penetrating the guide hole (200), wherein notches which go along an axial direction of the probe (10) are formed on angle regions of the probe (10), the angle regions facing the corner portions (200C) of the guide hole (200).

7 Claims, 10 Drawing Sheets

(56) References Cited

U.S. PATENT DOCUMENTS

| | | | | |
|---|---|---|---|---|
| 6,515,496 | B2* | 2/2003 | Felici | G01R 1/0675 |
| | | | | 324/750.25 |
| 7,118,393 | B1* | 10/2006 | Pupkiewicz | H01R 13/2414 |
| | | | | 439/91 |
| 7,850,460 | B2* | 12/2010 | Weiland | G01R 1/06733 |
| | | | | 439/66 |
| 9,618,536 | B2* | 4/2017 | Kuo | G01R 1/07357 |
| 9,702,904 | B2* | 7/2017 | Breinlinger | G01R 1/06716 |
| 9,972,933 | B2* | 5/2018 | Kimura | G01R 1/07357 |
| 10,006,938 | B2* | 6/2018 | Breinlinger | G01R 1/06705 |
| 10,215,801 | B2* | 2/2019 | Nasu | G01R 1/07314 |
| 2007/0167022 | A1 | 7/2007 | Tsai et al. | |
| 2015/0280345 | A1* | 10/2015 | Kimura | H01R 13/2428 |
| | | | | 439/700 |

FOREIGN PATENT DOCUMENTS

| | | | |
|---|---|---|---|
| JP | 2002323515 | A | 11/2002 |
| JP | 2005009927 | A | 1/2005 |
| JP | 2006164660 | A | 6/2006 |
| JP | 2015504164 | A | 2/2015 |
| JP | 2015118064 | A | 6/2015 |

* cited by examiner

ELECTRICAL CONNECTION DEVICE

TECHNICAL FIELD

The present invention relates to an electrical connection device for use in measuring electrical characteristics of an inspection object.

BACKGROUND ART

In order to measure electrical characteristics of an inspection object such as an integrated circuit in a state where the inspection object is not separated from a wafer, an electrical connection device including probes to be brought into contact with the inspection object is used. The probes are held, for example, in a state of penetrating guide holes formed in a probe head (for example, refer to PTL 1).

For the probes, those in each of which a shape of a cross section perpendicular to an axial direction is polygonal are also used. For example, probes in each of which a shape of a cross section perpendicular to an axial direction is quadrangular are used for measuring micro electro mechanical systems (MEMS). In this case, a shape of guide holes of a probe head is also formed into a quadrangular shape in response to the shape of each cross section of the probes.

CITATION LIST

Patent Literature

PTL 1—Japanese Patent Laid-Open Publication No. 2015-118064

SUMMARY OF INVENTION

Technical Problem

When the shape of the guide holes formed in the probe head is polygonal, it is general that a corner portion of each guide hole is formed to be round-chamfered. Therefore, there has been a problem that an angle region of each probe contacts an inner wall surface of the corner portion of the guide hole, resulting in that the probe is worn or damaged.

In consideration of the above-described problem, it is an object of the present invention to provide an electrical connection device in which the wear or damage of the probe is suppressed, the wear or the damage resulting from the contact between the angle region of the probe and the inner wall surface of the guide hole of the probe head.

Solution to Problem

In accordance with an aspect of the present invention, there is provided an electrical connection device including: a probe head including a guide hole, in which a shape perpendicular to an extending direction of the guide hole is a shape formed by round-chamfering corner portions of a polygonal shape; and a probe held by the probe head in a state of penetrating the guide hole, wherein notches which go along an axial direction of the probe are formed on angle regions of the probe, the angle regions facing the corner portions of the guide hole.

Advantageous Effects of Invention

In accordance with the present invention, there can be provided the electrical connection device in which the wear or damage of the probe is suppressed, the wear or the damage resulting from the contact between the angle regions of the probe and the inner wall surface of the guide hole of the probe head.

BRIEF DESCRIPTION OF DRAWINGS

FIG. 6($a$) is a plan view; FIG. 6($b$) is a cross-sectional view; and FIG. 6($c$) is a perspective view of a distal end region.

FIG. 7($a$) is a plan view; FIG. 7($b$) is a cross-sectional view; and FIG. 7($c$) is a perspective view of a distal end region.

FIG. 8($a$) is a plan view; FIG. 8($b$) is a cross-sectional view; and FIG. 8($c$) is a perspective view of a distal end region.

FIG. 9($a$) is a plan view; FIG. 9($b$) is a cross-sectional view; and FIG. 9($c$) is a perspective view of a distal end region.

FIG. 10($a$) is a plan view; FIG. 10($b$) is a cross-sectional view; and FIG. 10($c$) is a perspective view of a distal end region.

FIG. 11($a$) is a plan view; and FIG. 11($b$) is a cross-sectional view along a B-B direction in FIG. 11($a$).

DESCRIPTION OF EMBODIMENT

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

Figure 1:
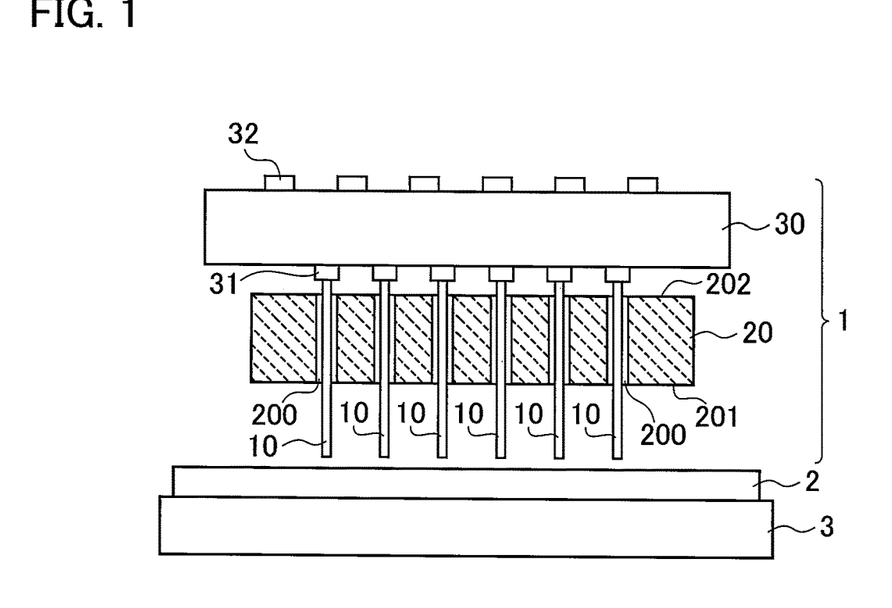
FIG. 1 is a schematic diagram illustrating a configuration of an electrical connection device according to an embodiment of the present invention.

As illustrated in FIG. 1, an electrical connection device 1 according to an embodiment of the present invention includes: probes 10; a probe head 20 that holds the probes 10; and an electrode substrate 30 attached with the probe head 20. The electrical connection device 1 is a vertical operation-type probe card for use in measuring electrical characteristics of an inspection object 2. During measurement of the inspection object 2, distal end portions of the probes 10 contact inspecting pads (not illustrated) for the inspection object 2. FIG. 1 illustrates a state where the probes 10 are not in contact with the inspection object 2. During the measurement, for example, a chuck 3 on which the inspection object 2 is mounted rises, and the distal end portions of the probes 10 contact the inspection object 2.

The probe head 20 includes guide holes 200 which penetrate an inside thereof between a first main surface 201 facing the inspection object 2 and a second main surface 202 facing the electrode substrate 30. The probes 10 are held by the probe head 20 in a state of penetrating the guide holes 200.

As illustrated in FIG. 1, proximal end portions of the probes 10, which protrude from the second main surface 202 of the probe head 20, connect to electrode pads 31 formed on a lower surface of the electrode substrate 30. The electrode pads 31 are electrically connected to connection pads 32, which are arranged on an upper surface of the electrode substrate 30, by electrode wirings (not illustrated) formed inside the electrode substrate 30. The connection pads 32 are electrically connected to an inspection device such as an IC tester (not illustrated). Predetermined voltage and current are applied through the probes 10 to the inspection object 2 by the inspection device. Then, signals output from the inspection object 2 are sent through the probes 10 to the inspection device, and the characteristics of the inspection object 2 are inspected.

A shape of cross sections of the probes 10, which are perpendicular to an axial direction thereof (hereinafter, simply referred to as "cross sections"), is polygonal. A shape of the guide holes 200, which is perpendicular to an extending direction thereof (hereinafter, referred to as a "hole shape"), is a shape formed by round-chamfering corner portions of the polygonal shape corresponding to the shape of the cross section of each probe 10.

Figure 2:
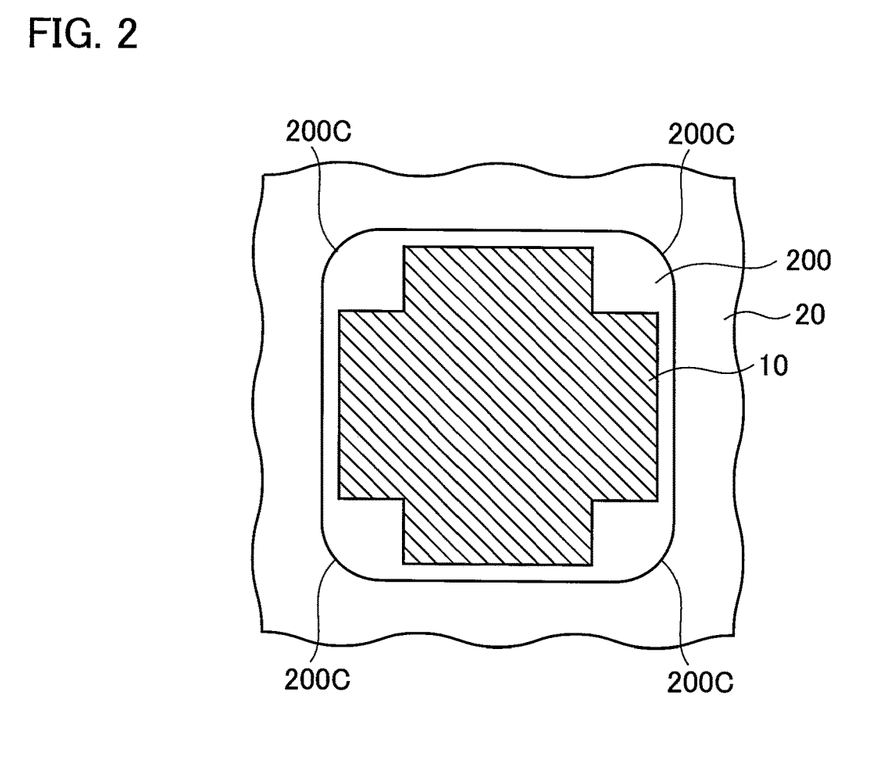
FIG. 2 is a schematic plan view illustrating shapes of a cross section of a probe and a guide hole of a probe head in the electrical connection device according to the embodiment of the present invention.

FIG. 2 illustrates an example where the cross section of the probe 10 is quadrangular. In response to the shape of the cross section of the probe 10, the hole shape of the guide hole 200 is a shape having four round-chamfered corner portions 200C and approximate to a quadrangular shape. In a case of forming the hole shape of the guide hole 200 into the polygonal shape, it is general that the corner portions 200C of the guide hole 200 are round-chamfered as illustrated in FIG. 2 due to a problem of processing, and the like. For example, in a case of the quadrangular guide hole 200 in which a length of each side is 40 µm the corner portions 200C are round-chamfered with a size of 8 µm.

As illustrated in FIG. 2, on angle regions facing the corner portions 200C of the guide hole 200, notches are formed along the axial direction of the probe 10. In the example illustrated in FIG. 2, the notches formed on the probe 10 have a shape in which the angle regions are cut into a quadrangular shape on the cross section perpendicular to the axial direction.

Incidentally, as an area of the cross section of the probe 10 is larger, a capacity of a current flowing through the probe 10 increases. The area of the cross section of the probe 10 is maximized when vertices of the angle regions are tangent to vertices of a circular arc of the guide hole 200. For example, in a case of a probe 10 in a comparative example where the notches are not formed on angle regions as illustrated in FIG. 3, the area of the cross section is maximized.

Figure 3:
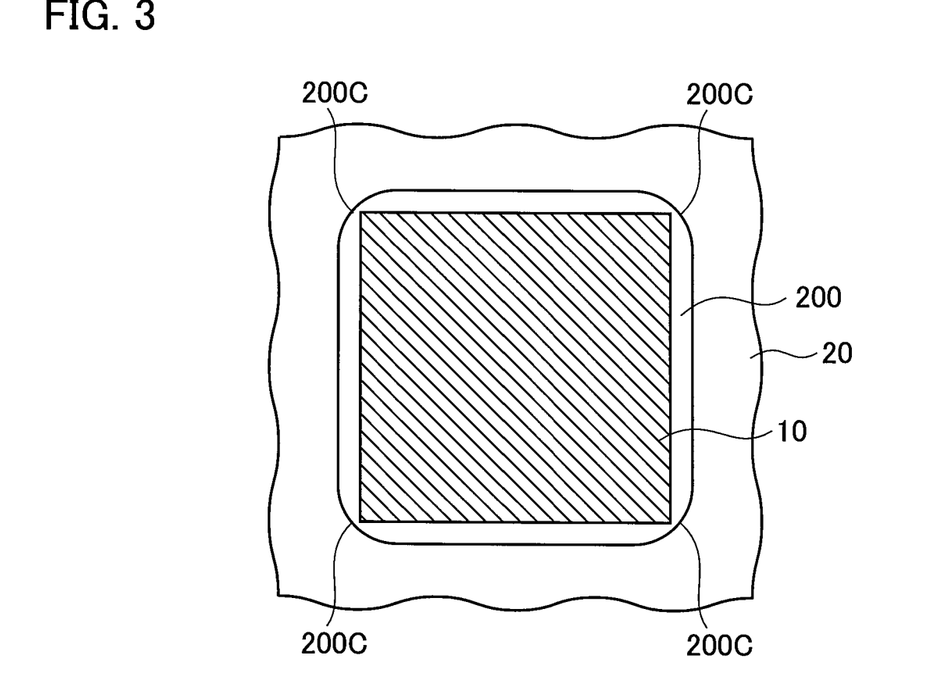
FIG. 3 is a schematic plan view illustrating shapes of a cross section of a probe and a guide hole of a probe head in a comparative example.

However, in a state illustrated in FIG. 3, the angle regions of the probe 10 contact an inner wall surface of the guide hole 200, and accordingly, the probes 10 are worn or damaged. For example, when the probes 10 are held inside the probe head 20 in a state of being curved by elastic deformation as illustrated in FIG. 4, the probes 10 slide inside the guide holes 200, and accordingly, the probes 10 are liable to be worn due to contact thereof with the inner wall surface of the guide holes 200.

Figure 4:
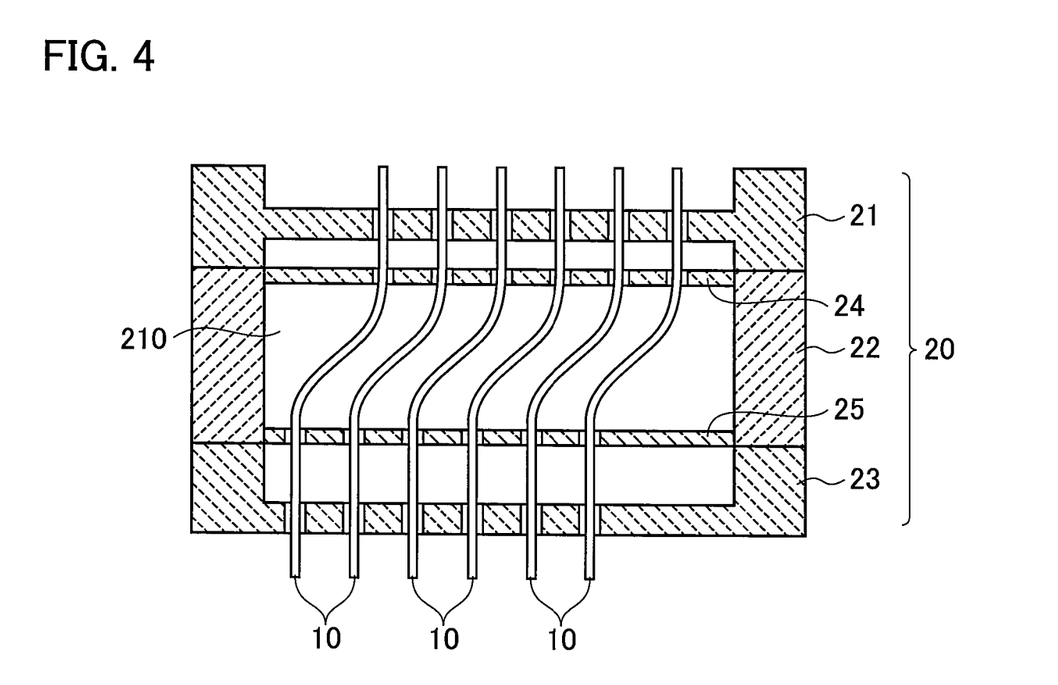
FIG. 4 is a schematic diagram illustrating examples of the probe and the probe head in the electrical connection device according to the embodiment of the present invention.

The probe head 20 illustrated in FIG. 4 includes a top portion 21, an upper guide portion 24, a lower guide portion 25 and a bottom portion 23, each of which allows the penetration of the probes 10. Each of the top portion 21, the upper guide portion 24, the lower guide portion 25 and the bottom portion 23 has guide holes which allow the penetration of the probes 10. Then, the notches are formed on at least the angle regions of the probes 10, which face the corner portions of the individual guide holes. A spacer 22 is disposed between the top portion 21 and the bottom portion 23 in the probe head 20, whereby a hollow region 210 is composed. Then, the guide holes of the top portion 21 and the guide holes of the bottom portion 23, through which the same probes 10 pass, are arranged to be positionally shifted from each other. Therefore, the probes 10 are curved due to the elastic deformation.

In the probe head 20 illustrated in FIG. 4, when the distal end portions of the probes 10 contact the inspection object 2 at the time of starting to measure the inspection object 2, the probes 10 buckle in the hollow region 210. That is, the probes 10 are far more curved due to flexural deformation. Thus, the probes 10 contact the inspection object 2 with a predetermined pressure. Since the probes 10 have elasticity, the probes 10 return to a shape before contacting the inspection object 2 when the probes 10 and the inspection object 2 turn to a non-contact state after the measurement is ended.

As described above, the probes 10 held by the probe head 20 illustrated in FIG. 4 slide inside the guide holes 200 when the measurement of the inspection object 2 is started and ended. Therefore, in the state illustrated in FIG. 3, the angle regions of each probe 10 are liable to contact the inner wall surface of each guide hole 200.

Figure 5:
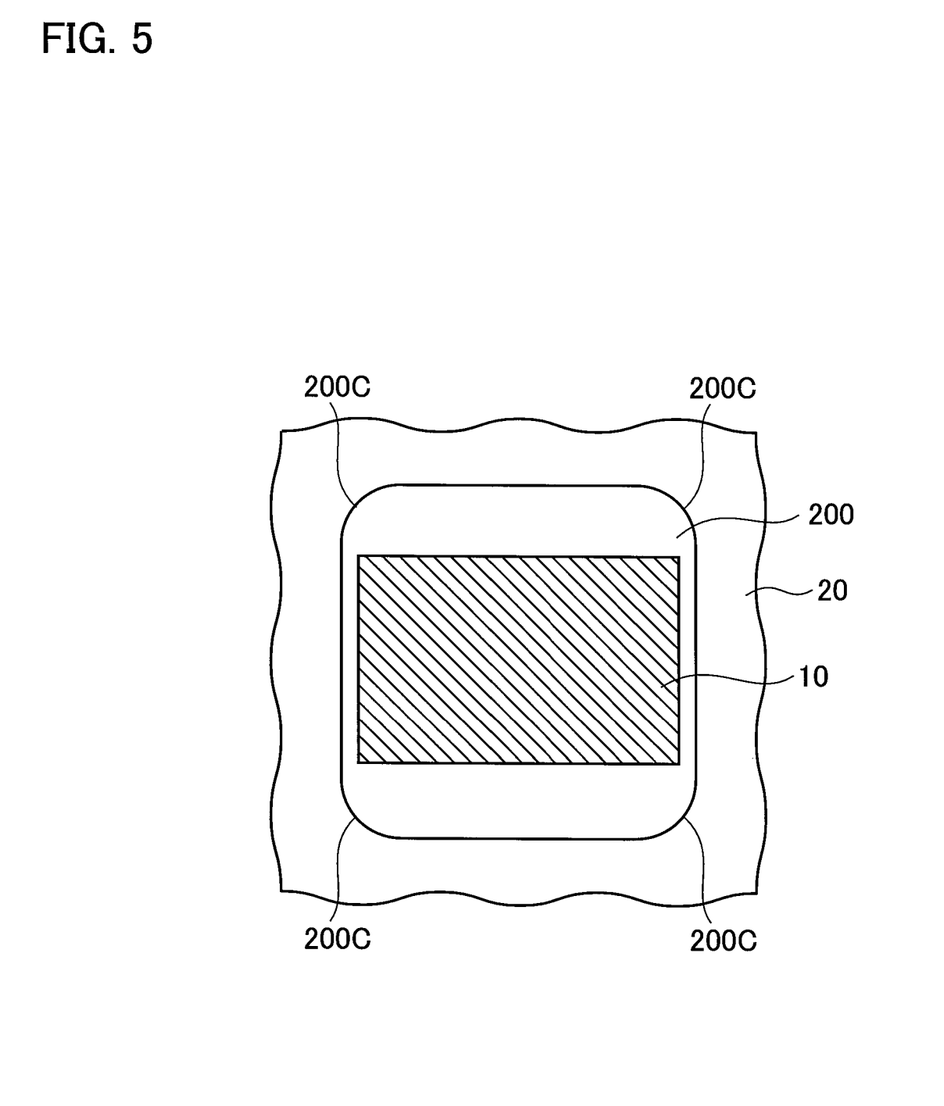
FIG. 5 is a schematic plan view illustrating shapes of a cross section of a probe and a guide hole of a probe head in another comparative example.
Figure 6:
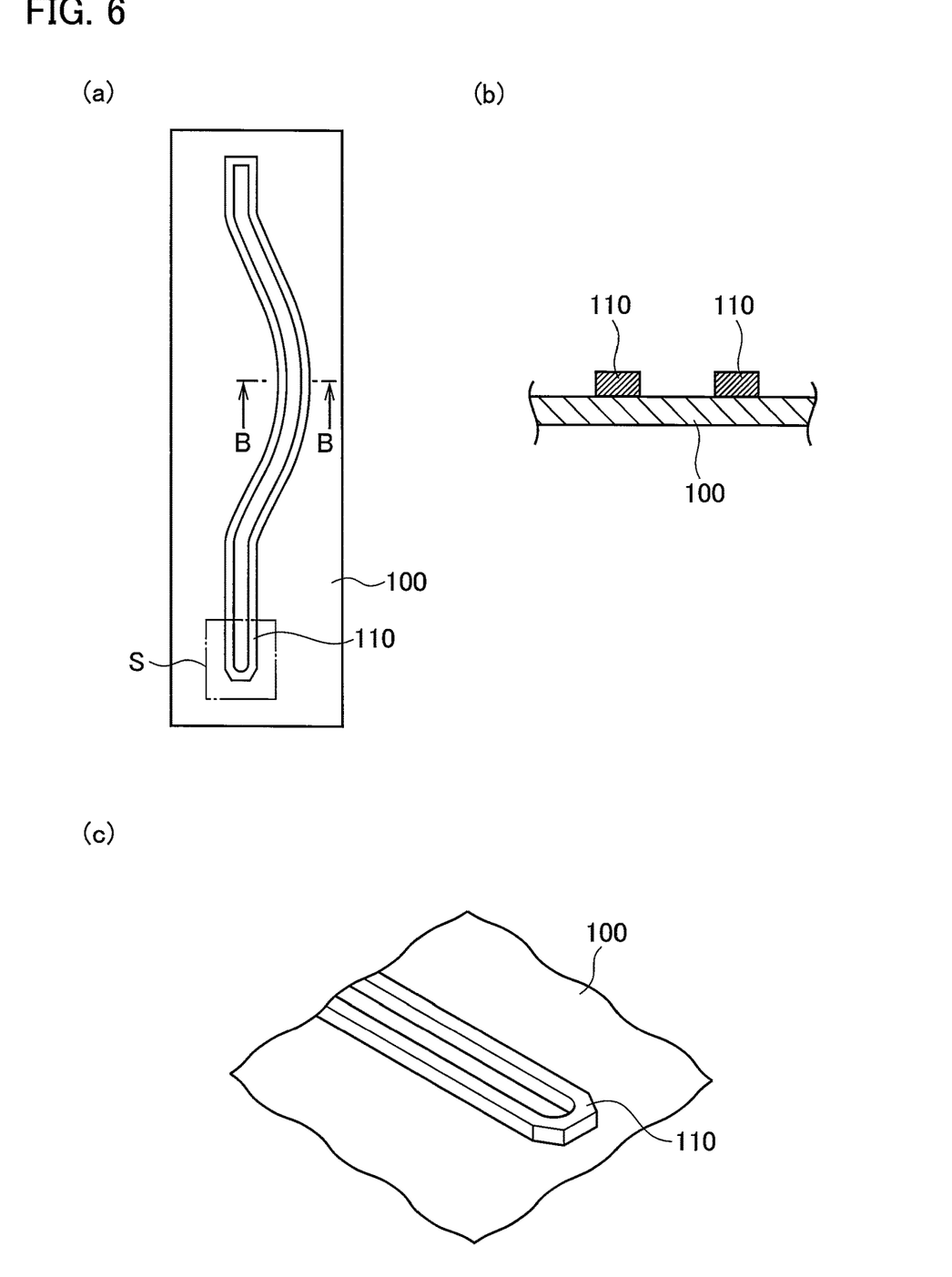
FIG. 6 is schematic process diagrams for explaining a method for manufacturing the probe in the electrical connection device according to the embodiment of the present invention (No. 1)
Figure 7:
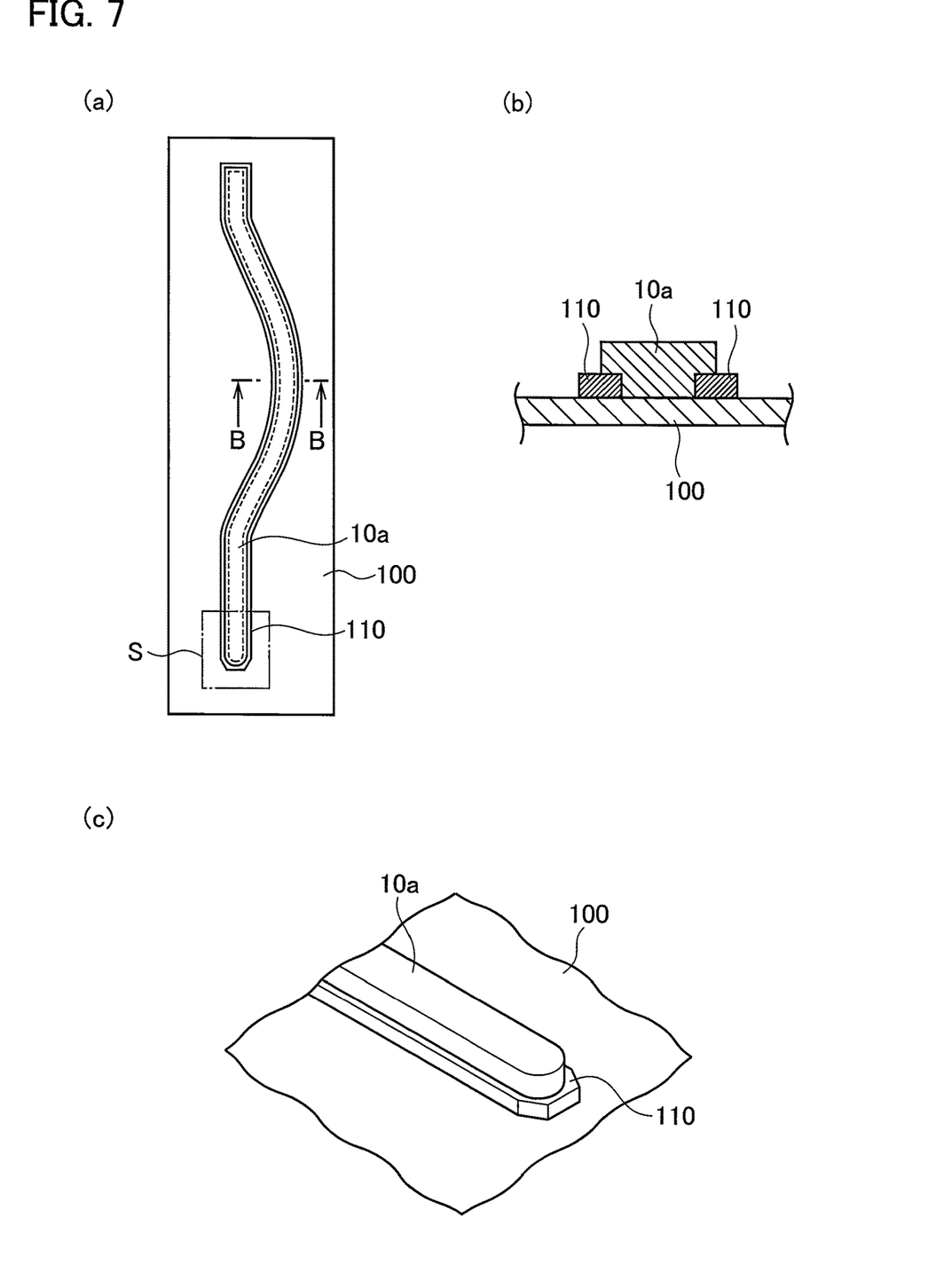
FIG. 7 is schematic process diagrams for explaining a method for manufacturing the probe in the electrical connection device according to the embodiment of the present invention (No. 2)
Figure 8:
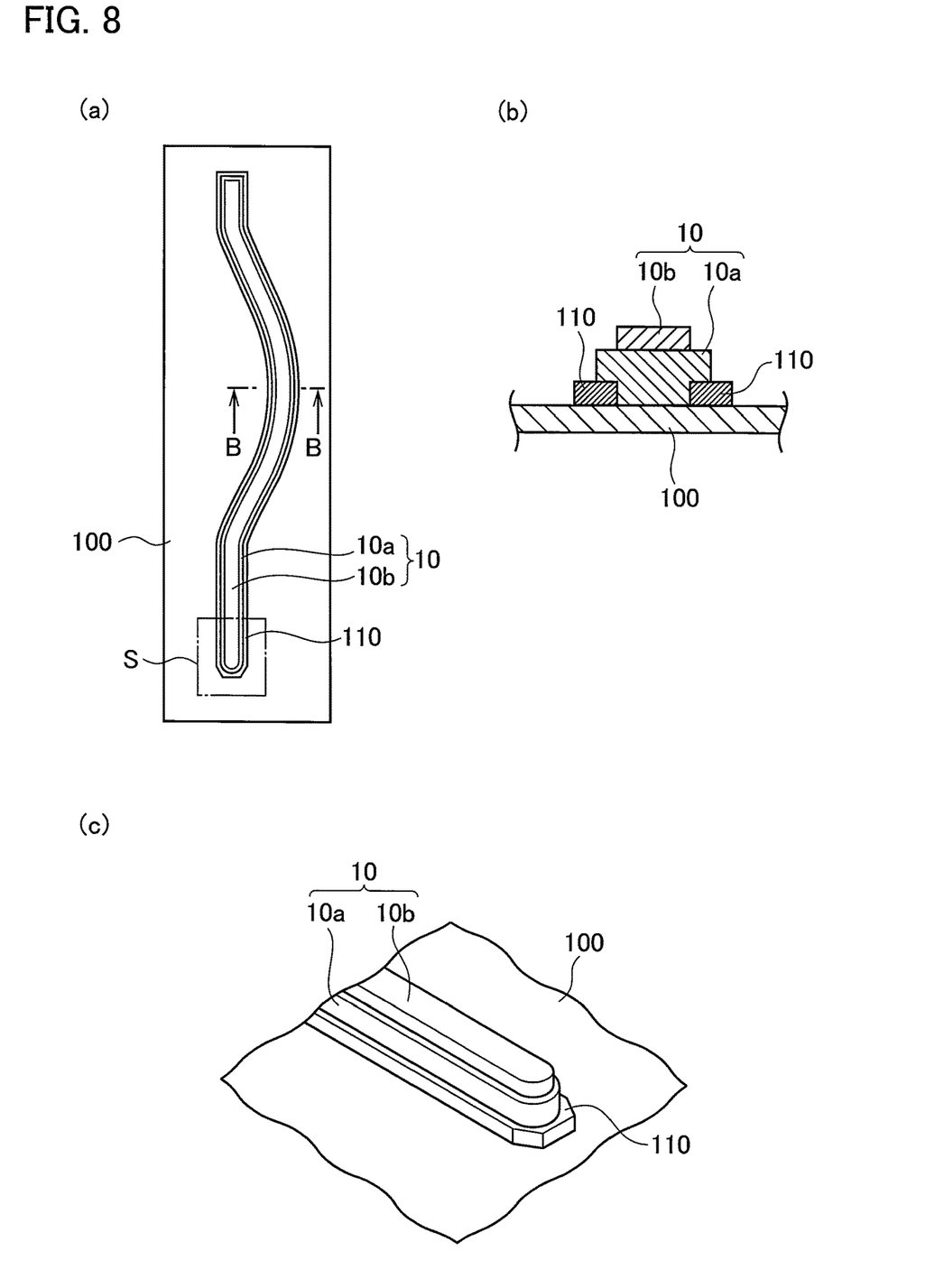
FIG. 8 is schematic process diagrams for explaining a method for manufacturing the probe in the electrical connection device according to the embodiment of the present invention (No. 3)
Figure 9:
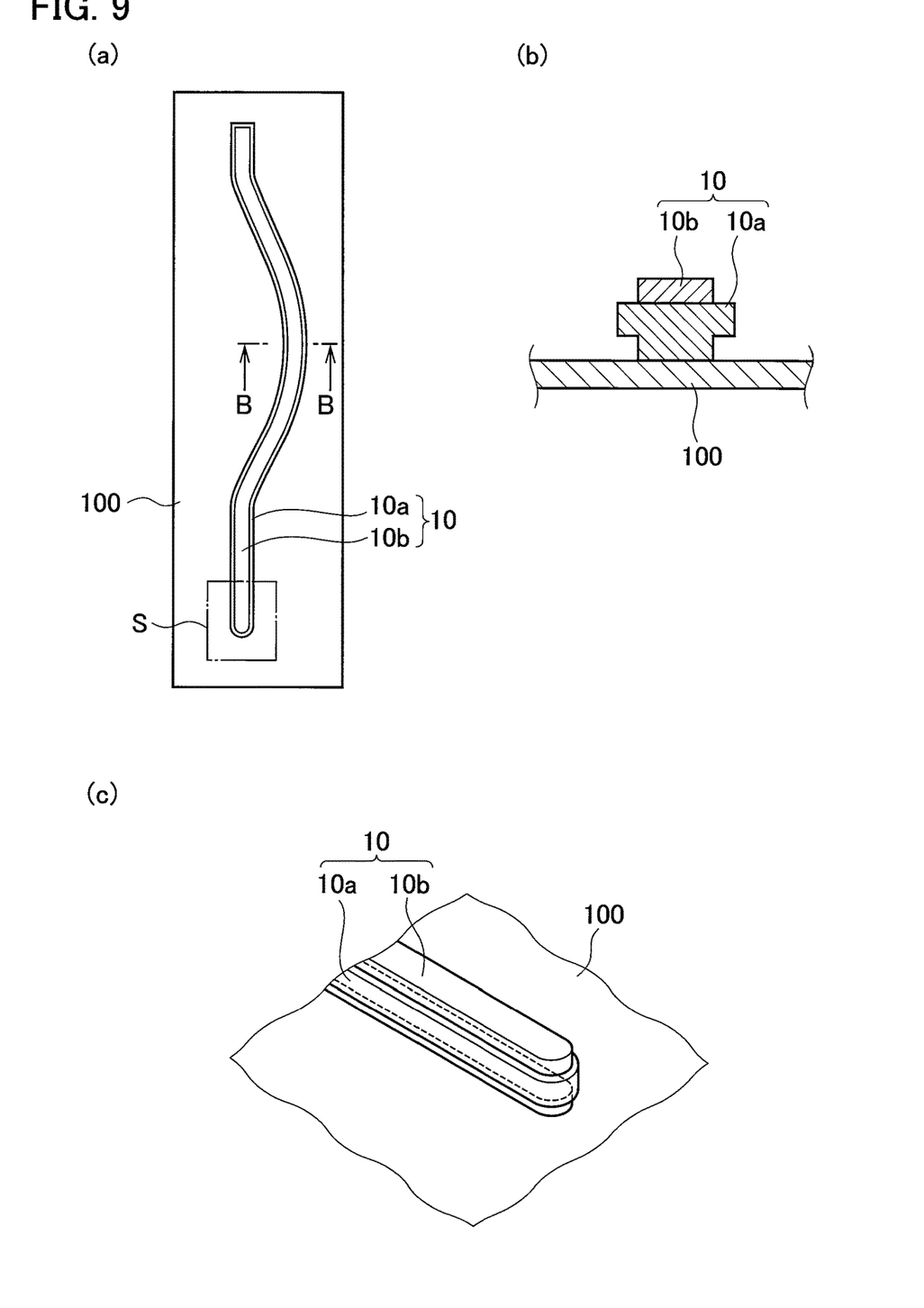
FIG. 9 is schematic process diagrams for explaining a method for manufacturing the probe in the electrical connection device according to the embodiment of the present invention (No. 4)
Figure 10:
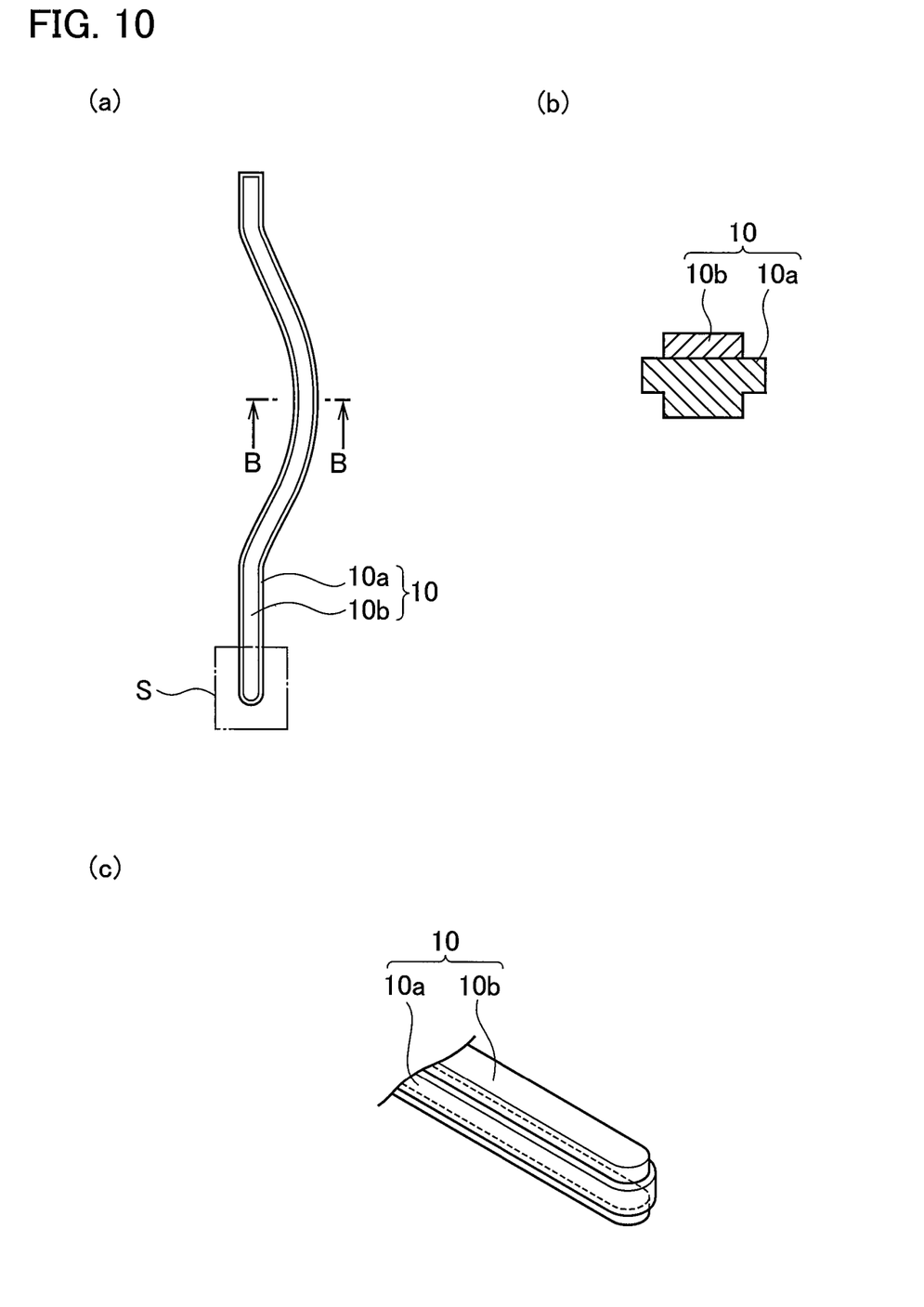
FIG. 10 is schematic process diagrams for explaining a method for manufacturing the probe in the electrical connection device according to the embodiment of the present invention (No. 5)

Meanwhile, as in a comparative example illustrated in FIG. 5, the area of the cross section of each probe 10 is reduced, whereby the contact between the probe 10 and the inner wall surface of the guide hole 200 can be suppressed. However, electrical resistance of the probe 10 increases by reducing the area of the cross section of the probe 10. Therefore, the capacity of the current flown through the probe 10 decreases, sometimes causing hindrance to the measurement of the inspection object 2.

In contrast, in the probe 10 illustrated in FIG. 2, the notches are formed on the angle regions thereof, and accordingly, a distance between each corner portion 200C of the guide hole 200 and each angle region of the probe 10 is larger than in the state of FIG. 3. Hence, even when the probe 10 slides inside the guide hole 200, and so on, the probe 10 does not contact the inner wall surface of the guide hole 200. Therefore, the probe 10 is suppressed from being worn or damaged. Moreover, the area of the cross section is reduced less than in the comparative example illustrated in FIG. 5, and accordingly, the capacity of the current flown through the probe 10 can be increased.

Moreover, even when the probe 10 contacts the inner wall surface of the guide hole 200, a plurality of spots of the probe 10 with respect to one angle region contact the inner wall surface of the guide hole 200 by the fact that the notches are formed on the angle regions of the probe 10. Therefore, a pressure with which the probe 10 contacts the inner wall surface of the guide hole 200 at each contact spot is reduced. Hence, the probe 10 is suppressed from being worn or damaged.

Preferably, a size of the notches formed on the probe 10 is set to an extent where the angle regions of the probe 10 do not contact the corner portions 200C of the guide hole 200. The size of the notches is set, for example, in consideration of assembly accuracy, changes over time in the position and shape of the probe 10, and the like. Moreover, the size of the notches is set also in consideration of changes of the position and shape of the probe 10 during the measurement.

Moreover, in each probe 10 held by the probe head 20 illustrated in FIG. 4, at least the notches just need to be formed on such angle regions of the probe 10, which closely face the corner portions 200C of the guide hole 200 when the probe 10 slides inside the guide hole 200. That is, the notches do not have to be always formed on such angle regions of the probe 10, which are spaced apart from the corner portions 200C of the guide hole 200 by a large distance. Thus, in comparison with the area of the cross section of the probe 10 illustrated in FIG. 2, the notches are not formed on all the angle regions facing the corner portions 200C, and accordingly, the reduction in the area of the cross section of the probe 10 can be reduced less than in the example illustrated in FIG. 2. Therefore, the capacity of the current flown through the probe 10 can be increased.

As described above, in accordance with the electrical connection device 1 according to the embodiment of the present invention, the notches are formed on the angle regions of the probe 10, whereby the wear or damage of the probe 10, which results from the contact between the probe 10 and the inner wall surface of the guide hole 200, can be suppressed. Moreover, the area of the cross section is reduced less, and accordingly, the capacity of the current flown through the probe 10 can be suppressed from decreasing.

Hereinafter, referring to FIG. 6 to FIG. 10, a description will be given of the method for manufacturing the probes 10 of the electrical connection device 1 according to the embodiment of the present invention. Note that the method for manufacturing the probes 10, which will be mentioned below, is merely an example, and as a matter of course, the electrical connection device is achievable by a variety of manufacturing methods other than this mentioned method, the manufacturing methods including modifications thereof. In FIG. 6 to FIG. 10, (a) thereof are plan views, and (b) thereof are cross-sectional views along a B-B direction of (a). (c) of FIG. 6 to FIG. 10 are perspective views of a distal end region S of each probe 10, which is surrounded by broken lines in (a).

First, as illustrated in FIG. 6(a) to FIG. 6(c), a sacrificial layer 110 is formed on an upper surface of a support substrate 100. The sacrificial layer 110 has a shape that goes along an outer edge shape of the probe 10. As will be described later, a part of the probe 10 is formed in a region surrounded by the sacrificial layer 110. The sacrificial layer 110 is formed by copper plating or the like.

Subsequently, as illustrated in FIG. 7(a) to FIG. 7(c), on an upper surface of the sacrificial layer 110, a portion 10a having a T-like cross-sectional shape is formed as a part of the probe 10 so as to embed the region surrounded by the sacrificial layer 110. Then, on an upper surface of the portion 10a, a remaining portion 10b of the probe 10 is formed symmetrically to the region surrounded by the sacrificial layer 110. Thus, as illustrated in FIG. 8(a) to FIG. 8(c), the probe 10 is formed.

Thereafter, as illustrated in FIG. 9(a) to FIG. 9(c), the sacrificial layer 110 is removed from the support substrate 100. Moreover, as illustrated in FIG. 10(a) to FIG. 10(c), the probe 10 is peeled off from the support substrate 100, and the probe 10 is completed.

For a material of the probe 10, for example, a nickel (Ni) alloy or the like is used. Note that, though such a manufacturing method using a semi-additive method has been described above, it is possible to manufacture the probe 10 by a subtractive method or a complex process of both thereof. Moreover, it is possible to manufacture the probe 10 by a dry process such as thermoelectrolytic plating and evaporation.

Figure 11:
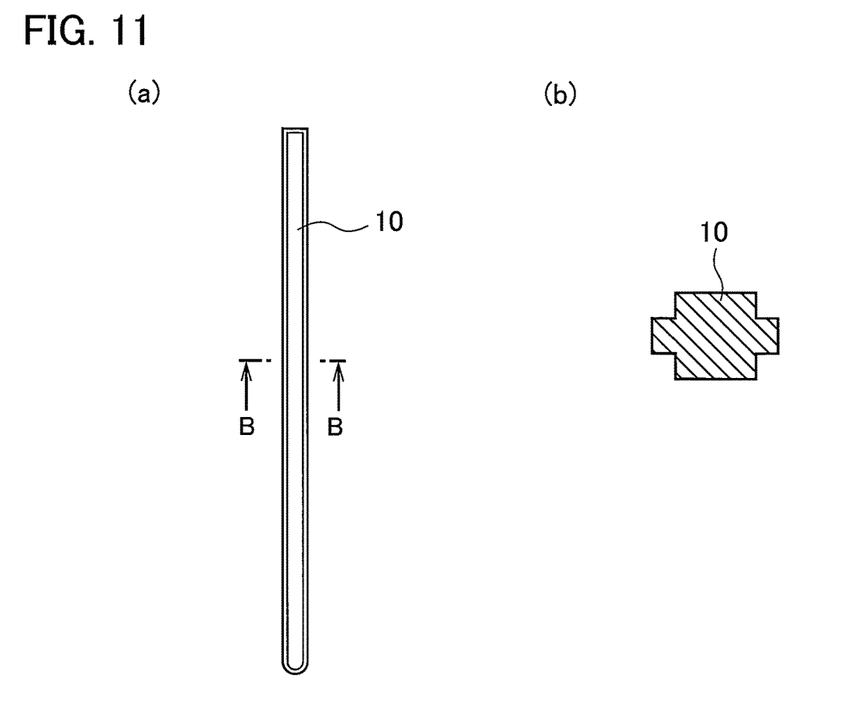
FIG. 11 is schematic diagrams illustrating another example of the probe in the electrical connection device according to the embodiment of the present invention.

Moreover, the manufacturing method has been described above with regard to the probe 10 having a curved shape in plan view. However, as a matter of course, the shape of the probe 10 is not limited to the curved shape, and as illustrated in FIG. 11 for example, the probe 10 may have a linear shape.

Modification

Figure 12:
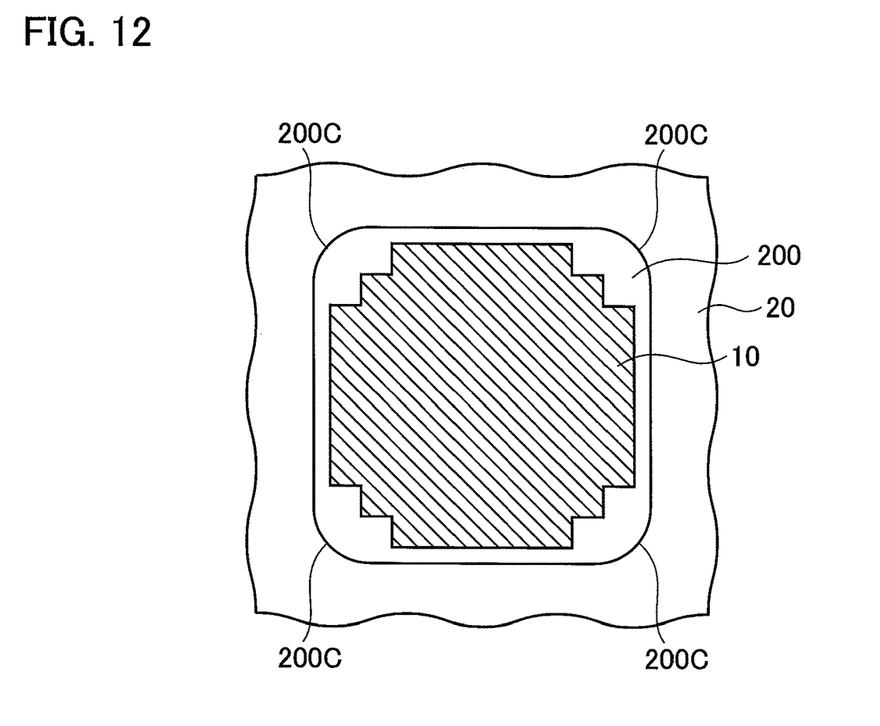
FIG. 12 is a schematic plan view illustrating shapes of a cross section of a probe and a guide hole of a probe head in an electrical connection device according to a modification of the embodiment of the present invention.

The shape of the notches formed on the probe 10 is arbitrarily settable. That is, though the example has been illustrated above where the notches of the probe 10 have the shape in which the angle regions are cut into the quadrangular shape, the notches may have other shapes. For example, as illustrated in FIG. 12, the notches may have a shape in which the angle regions are cut into a stair shape on the cross section perpendicular to the axial direction. In accordance with the notches having the shape illustrated in FIG. 12, the area of the cross section of the probe 10 can be increased in comparison with the notches having the shape illustrated in FIG. 2. Therefore, the capacity of the current flown through the probe 10 can be increased.

Figure 13:
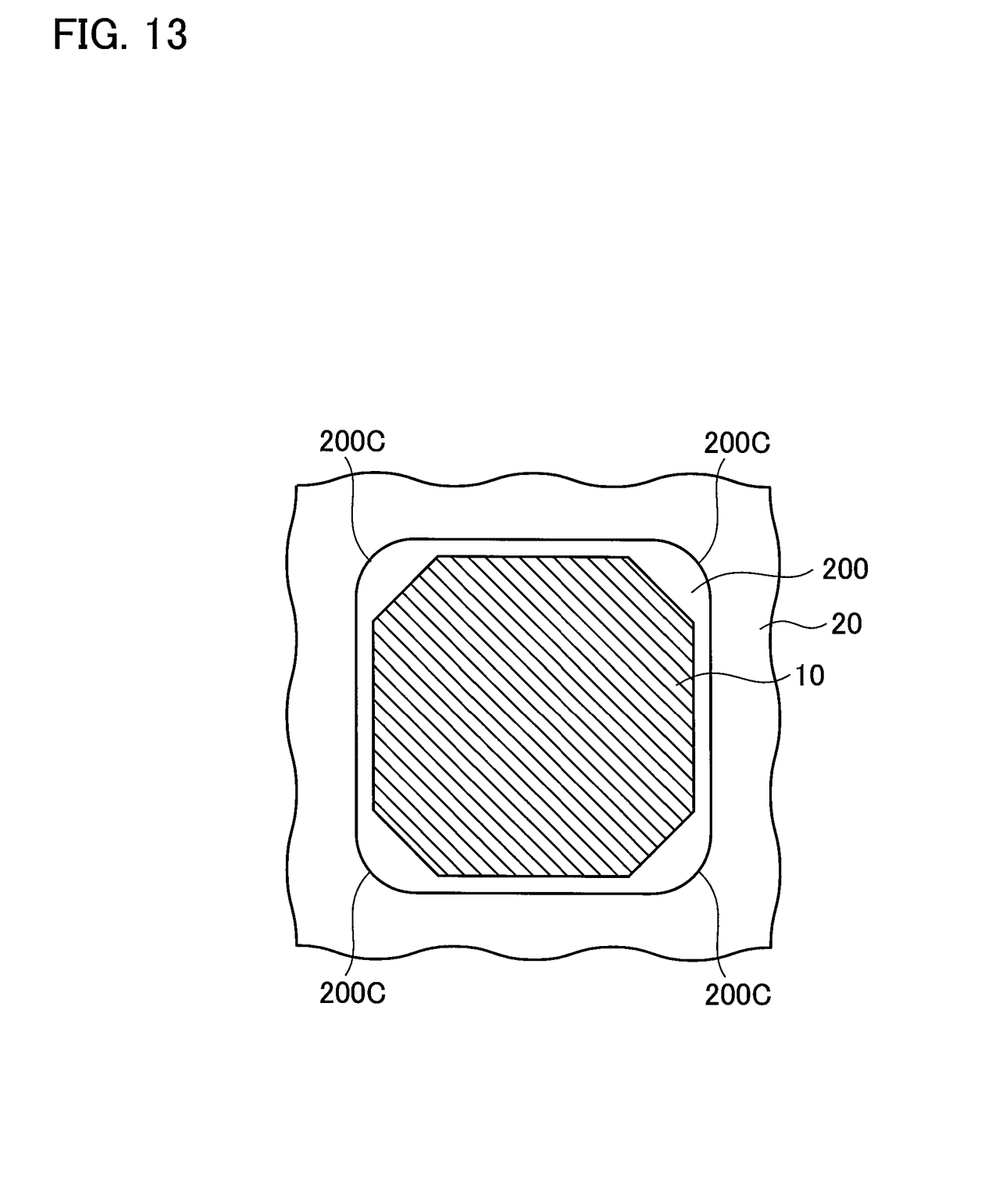
FIG. 13 is a schematic plan view illustrating shapes of a cross section of a probe and a guide hole of a probe head in an electrical connection device according to another modification of the embodiment of the present invention.

Alternatively, as illustrated in FIG. 13, the angle regions of the probe 10 may be chamfered to form the notches. Thus, the contact between the probe 10 and the corner portions 200C of the guide hole 200 can be suppressed, and the reduction of the area of the cross section of the probe 10 can be suppressed.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

For example, though the case has been illustrated above where the probe 10 in the state where the notches are not formed on the angle regions has a quadrangular cross section, the cross section of the probe 10 may have other polygonal shapes. For example, also when the cross section of the probe 10 and the hole shape of the guide hole 200 are pentagonal or hexagonal, the wear or breakage of the probe 10 can be suppressed by forming the notches on the angle regions along the axial direction.

As described above, it is natural that the present invention incorporates a variety of embodiments which are not described herein.

INDUSTRIAL APPLICABILITY

The electrical connection device of this embodiment is applicable to the characteristic measurement field of objects to be inspected.

What is claimed is:

1. An electrical connection device comprising:
   a probe head including a guide hole, in which a shape perpendicular to an extending direction of the guide hole is a shape formed by round-chamfering corner portions of a polygonal shape; and
   a probe held by the probe head in a state of penetrating the guide hole,
   wherein notches which go along an axial direction of the probe are formed on angle regions of the probe, the angle regions facing the corner portions of the guide hole.

2. The electrical connection device according to claim 1, wherein the notches have a shape in which the angle regions are cut into a quadrangular shape on a cross section perpendicular to the axial direction.

3. The electrical connection device according to claim 1, wherein the notches have a shape in which the angle regions are cut into a stair shape on a cross section perpendicular to the axial direction.

4. The electrical connection device according to claim 1, wherein the notches are formed by chamfering the angle regions of the probe.

5. The electrical connection device according to claim 1, wherein the shape perpendicular to the extending direction of the guide hole is a shape having four pieces of the corner portions and approximate to a quadrangular shape.

6. The electrical connection device according to claim 1, wherein the probe is held inside the probe head in a state of being curved by elastic deformation.

7. The electric connection device according to claim 1,
   wherein the probe head includes a top portion, an upper guide portion, a lower guide portion, and a bottom portion,
   each of the top portion, the upper guide portion, the lower guide portion and the bottom portion has the guide hole that allows penetration of the probe, and
   the notches are formed on at least the angle regions of the probe, the angle regions facing the corner portions of the guide hole.

* * * * *